(12) United States Patent
Kato (10) Patent No.: US 8,560,993 B2
(45) Date of Patent: Oct. 15, 2013

(54) SEMICONDUCTOR DEVICE AND METHOD OF TESTING THE SAME

(75) Inventor: Yoshiharu Kato, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 424 days.

(21) Appl. No.: 12/492,957

(22) Filed: Jun. 26, 2009

(65) Prior Publication Data

US 2009/0261853 A1   Oct. 22, 2009

Related U.S. Application Data

(62) Division of application No. 11/583,131, filed on Oct. 19, 2006, now Pat. No. 7,562,335.

(30) Foreign Application Priority Data

Oct. 20, 2005 (JP) ................................ 2005-305762

(51) Int. Cl.
*G06F 17/50* (2006.01)

(52) U.S. Cl.
USPC ............ 716/113; 716/119; 716/126; 716/136

(58) Field of Classification Search
USPC ................... 716/113, 119, 126, 136
See application file for complete search history.

(56) References Cited

U.S. PATENT DOCUMENTS

| | | | |
|---|---|---|---|
| 5,498,983 A | 3/1996 | Schoellkopf | |
| 5,886,946 A * | 3/1999 | Ooishi | 365/233.1 |
| 6,188,637 B1 * | 2/2001 | Ooishi | 365/233.11 |
| 6,501,309 B1 * | 12/2002 | Tomita | 327/158 |
| 2006/0126412 A1 | 6/2006 | Maki | |

FOREIGN PATENT DOCUMENTS

| | | |
|---|---|---|
| JP | 6-051025 A | 2/1994 |
| JP | 7-181234 A | 7/1995 |
| JP | 9-257884 A | 10/1997 |
| JP | 2002-286805 A | 10/2002 |
| JP | 2003-028928 A | 1/2003 |
| WO | WO-2005/008677 | 1/2005 |

OTHER PUBLICATIONS

USPTO, Notice of Allowance and Notice of Allowability, Mar. 9, 2009, in parent U.S. Appl. No. 11/583,131 [now USP 7,562,335].

(Continued)

*Primary Examiner* — Thuan Do
(74) *Attorney, Agent, or Firm* — Fujitsu Patent Center (57) ABSTRACT

An object is to provide a semiconductor device in which it is possible to determine whether or not a minute delay time given by a delay circuit is within a specified value or not, and a method of testing the semiconductor device. In response to a data strobe signal TDQS for testing, the delay circuits DC0 and DC1 produce delay data strobe signals IDQS0 and IDQS1 delayed by delay times DT0 and DT1. Outputted as a reverse signal from the inverter INV0, is a reverse data strobe signal RIDQS0 in response to the delay data strobe signal IDQS0, and delayed by an allowable delay time IT. Inputted into the NAND gate ND0, are the reverse data strobe signal RIDQS0 and the delay data strobe signal IDQS1. When, in comparison with the phase of the delay data strobe signal IDQS0, the phase of the delay data strobe signal IDQS1 is delayed by the allowable delay time IT or more, a pulse signal PL0 is not outputted from the NAND gate ND0.

4 Claims, 7 Drawing Sheets

CIRCUIT BLOCK DIAGRAM OF DRAM CONTROL CIRCUIT 1

(56) References Cited

OTHER PUBLICATIONS

USPTO, Non-Final Rejection, Aug. 13, 2008, in parent U.S. Appl. No. 11/583,131 [now USP 7,562,335].

USPTO, Restriction/Election Requirement, May 30, 2008, in parent U.S. Appl. No. 11/583,131 [now USP 7,562,335].

"Japanese Official Action", English Translation, dated Feb. 3, 2009.

* cited by examiner

TIMING CHART (NO. 2) OF DRAM CONTROL CIRCUIT 1

FIG.4

TIMING CHART (NO. 3) OF DRAM CONTROL CIRCUIT 1

FIG.5 CIRCUIT BLOCK DIAGRAM OF DRAM CONTROL CIRCUIT 1B

FIG.6 CIRCUIT BLOCK DIAGRAM OF DRAM CONTROL CIRCUIT 1A

FIG.7 CIRCUIT BLOCK DIAGRAM OF DRAM CONTROL CIRCUIT 1C

SEMICONDUCTOR DEVICE AND METHOD OF TESTING THE SAME

CROSS-REFERENCE TO RELATED APPLICATIONS

This application is a divisional application of U.S. Ser. No. 11/583,131, filed Oct. 19, 2006, now U.S. Pat. No. 7,562,335 which claims benefit of priority upon Japanese Patent Application No. 2005-305762 filed on Oct. 20, 2005, the entire contents of the aforementioned parent U.S. application and priority Japanese application are incorporated herein by reference.

BACKGROUND OF THE INVENTION

1. Field of the Invention

The present invention relates to a semiconductor device including a delay circuit, and particularly to a semiconductor device in which a determination can still be made as to whether or not a delay time is within a specified value even when a delay time of the delay circuit is a minute value, and to a method of testing such a semiconductor device.

2. Description of Related Art

Some semiconductor devices include a delay circuit for delaying an external signal. For example, a Dynamic Random Access Memory (DRAM) controller delays by a predetermined phase a data strobe signal inputted from a Synchronous Dynamic Random Access Memory (SDRAM) in a DLL (Delayed Looked Loop) circuit, and stores the data inputted from the SDRAM by use of the signal that has thus been delayed.

In a delay circuit represented by these DLL circuits, cases may arise where a delay time extending beyond a specified value occurs due to an abnormal condition prevailing at a time that a semiconductor device is manufactured. In this context, an abnormal condition at a time of manufacturing way, for example, mean occurrences such as fluctuations in capacity value, short-circuits, and deformed patterns caused by foreign matter attaching itself to a delay circuit. Therefore, when the functioning of a semiconductor is tested, a delay time of a delay circuit can be measured with the use of a tester, and a semiconductor device having a delay circuit whose delay time extends beyond a specified value can accordingly be singled out as a defective product.

Further, Japanese unexamined patent publication No. 2002-286805 is disclosed as related art of the above.

SUMMARY OF THE INVENTION

However, according the increases in operational speeds of semiconductor devices in recent years, the cycles of signals inputted into a delay circuit have necessarily been curtailed, and delay times in delay circuits, and allowable values of deviations in delay times among delay circuits, have become minute values. Thus, to measure minute delay times, expensive testers with a high time resolution have needed to be used, a trend that has created the problem of increasing the costs of semiconductor devices. Also, in circumstances where a delay time is shorter than the time resolution of the tester, the delay time itself cannot be measured, and another problem arises insofar that a delay circuit in which an abnormal condition occurs cannot be detected.

The present invention has been made to solve at least one of problems in the background art described above, and it is an object of the invention to provide a semiconductor device in which, even when a delay time occurring in a delay circuit is a minute value, a determination can still be made as to whether or not a delay time is within a specified value, a semiconductor device in which a need for a tester with a high time resolution for purpose of determination is obviated, and a method of testing such a semiconductor device.

To achieve the above object, the present invention according to one aspect provides a semiconductor device having a plurality of delay circuits giving a substantially identical delay time to a signal inputted, the semiconductor device comprising: a logic inverting circuit provided on a signal output path of one of the delay circuits; an AND circuit into which an output signal from the logic inverting circuit and output signals from other delay circuits are inputted; and a latch circuit for storing a pulse signal outputted from the AND circuit.

Semiconductor devices are provided with a plurality of delay circuits producing a substantially identical delay time. A logic inverting circuit is provided on the signal output path of one of the delay circuits. In response to the signal outputted from the delay circuit the logic inverting circuit outputs a reverse phase signal that is delayed by a predetermined time. Inputted into an AND circuit are an output signal from the logic inverting circuit and an output signal from the other delay circuits. The AND circuit changes the level of input signals of the AND circuit during times when the levels of all inputted signals are of a predetermined an identical value, and as a result, outputs a pulse signal. For example, during times when all signals inputted into the AND circuit are of a high level, or of a low level, the AND circuit outputs a pulse signal. Inputted into a latch circuit are output signals from the AND circuit. Then, the latch circuit stores the pulse signal outputted from the AND circuit.

For example, in circumstances where frequency signals of an identical phase are inputted into a variety of delay circuits, the respective delay circuits output frequency signals with a delay time. At such times, deviations in the delay time occur among the delay circuits. Thus, deviations among delay circuits also occur in the phases of output signals. Further, since, in comparison with the phases of output signals from one of the delay circuits inputted through the logic inverting circuit, the phases of output signals from the other delay circuits are faster, a period of time occurs when the level of all signals inputted into the AND circuit becomes of a predetermined and identical level, and, a pulse signal is accordingly outputted from the AND circuit. On the other hand, since, in comparison with the phase of output signals from one of delay circuits inputted through the logic inverting circuit, the phase of at least one of the output signals from the other delay circuits is more delayed, a period of time when the level of all signals inputted into the AND circuit becomes of a predetermined and identical level does not occur, and no pulse signal is thus outputted from the AND circuit. In these circumstances, the pulse signal outputted from the AND circuit is held in the latch circuit.

In other words, in comparison with the phase of output signals from one of delay circuits in the AND circuit, a detection can be made as to whether or not the phase of output signals from the other delay circuits is more delayed by the delay time given by the logic inverting circuit or more, and the results thus detected can be stored in the latch section.

In the above manner, whether or not a phase difference among signals outputted from a plurality of delay circuits is within a specified value determined by the delay time of the logic inverting circuit can be calculated in the AND circuit. Therefore, by determining whether or not a degree of deviation in a delay time among delay circuits is within an allowable value, it becomes possible to detect any abnormality in a delay time value. It thus becomes possible for a semiconductor device having a delay circuit whose degree of deviation in delay time is beyond a specified value to be singled out as a defective product. Thus, even with a semiconductor device with a circuit developing a minute delay time that is shorter than the time resolution of a tester, an abnormal delay time can be detected without actually measuring the delay time, and as a result it becomes possible to determine whether or not a semiconductor is free of abnormalities.

Results that have been detected are held in the latch section, and in consequence when the results of calculations in the AND circuit are read from a semiconductor device, the requirement for an expensive tester with a high time resolution can be dispensed with.

To achieve the above object, the present invention according to another aspect provides a method of testing a semiconductor device producing a plurality of delay signals given a substantially identical delay time in response to an inputted signal, wherein the method comprising: producing a reverse phase signal in response to one of the delay signals, the reverse phase signal that is delayed by a predetermined time; detecting a coincident duration of time in which the reverse phase signal and the other delay signals are made to a predetermined level identical to each other; and storing the occurrence or otherwise of detections of the coincident duration of time.

In comparison with the phase of one of the delay signals, whether or not the phases of other delay signals are more delayed by a period of time that is longer than a delay time provided at a step for producing a reverse signal is detected during a step for detecting a coincident duration of time, and the results that are detected can be retained by means of a step for storing the occurrence, or otherwise, of a detection. In the above manner, by determining whether or not a degree of deviation in delay time among delay signals is within an allowable value, it becomes possible for an abnormal delay time to be detected. Thus, it becomes possible for a semiconductor device in which a degree of deviation in delay time among delay circuit exceeds an allowable range to be singled out as a defective product.

To achieve the above object, the present invention according to another aspect provides a semiconductor device which includes a delay circuit providing a delay time to an input signal, and which delay circuit is subject to a functioning test in response to a functioning test control signal, wherein, when an output signal of the delay circuit is reverse in phase to that of the input signal, the semiconductor device includes a switch circuit for connecting an output terminal and an input terminal of the delay circuit in response to the functioning test control signal, and a dividing section for dividing the output signal of the delay circuit; and when the output signal is identical in phase to that of the input signal, the semiconductor device includes the switch circuit, a logic inverting circuit provided on a path connecting the output terminal with the input terminal, and the dividing section.

The functioning of a semiconductor device can be tested in response to a function-test control signal. A delay circuit supplies a delay time to an input signal. In circumstances where the output signal of a delay circuit is made a phase that is the reverse of that of the input signal, the semiconductor device is provided with a switch circuit and a divider section. On the other hand, when the output signal of a delay circuit is made of a phase that is identical to that of the input signal, the semiconductor device is provided with a switch circuit, a logic inverting circuit and a divider section. When the functioning of the semiconductor is being tested, the switch circuit operates to connect the output terminal and the input terminal of the delay circuit. Thus, while a functioning test is being performed, a ring oscillator is configured for purposes of oscillating on a cycle that corresponds to the delay time of the delay circuit. While the functioning test is being performed, the divider section divides the output signal of the ring oscillator. After the cycle of the signal has been divided, it is read by an item of equipment such as an external tester.

In the above manner, while the functioning of a semiconductor device is being tested, an oscillating signal having a cycle corresponding to the delay time of a delay circuit is produced, and the oscillating signal is divided. It thus becomes possible for the functioning to be measured by an item of equipment such as a tester. In consequence, the delay time of a delay circuit can be calculated directly from the cycle of the oscillating signal. Therefore, it becomes possible for abnormalities in the delay time of a delay circuit to be detected. Thus, a semiconductor device that is equipped with a delay circuit whose delay time is abnormal can be singled out as a defective product.

Further, even when, because of a minute value of the time delay, the cycle of an oscillating signal becomes shorter than the time resolution of a tester, the oscillating signal is divided by the divider section, and thereafter measured. It thus becomes possible for the delay time to be measured, and the requirement for an expensive tester with a high time resolution can thus be dispensed with.

To achieve the above object, the present invention according to another aspect provides a method of testing a semiconductor device which includes a delay circuit that provides a delay time in response to an input signal, and which is subject to a functioning test in response to a functioning test control signal, wherein, when an output signal of the delay circuit is reverse in phase to that of the input signal, the method includes steps of inputting the output signal of the delay circuit into the delay circuit in response to the functioning test control signal, and dividing the output signal of the delay circuit; and when the output signal is identical in phase to that of the input signal, the method includes steps of producing a reverse phase signal of the output signal of the delay circuit, inputting the reverse phase signal into the delay circuit in response to the functioning test control signal, and dividing the output signal of the delay circuit.

In this manner, when a functioning test is performed, a ring oscillator is configured for oscillating on a cycle corresponding to the delay time of the delay circuit. By means of a step for dividing the output signal of the delay circuit the output signal of the oscillator is divided at a time during which the functioning test is being performed. After being divided, the cycle of the signal is read by an item of equipment such as an external tester. In the above manner, at a time when the functioning of a semiconductor device is being tested, an oscillating signal having a cycle corresponding to the delay time of the delay circuit is produced, the oscillating signal is divided, and then the cycle can be measured by means of equipment such as a tester. Thus, from the cycle of the oscillating signal, the delay time of the delay circuit can be directly calculated.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 6 is a circuit block diagram of a DRAM control circuit 1a; and

DETAILED DESCRIPTION OF THE PREFERRED EMBODIMENTS

Figure 1:
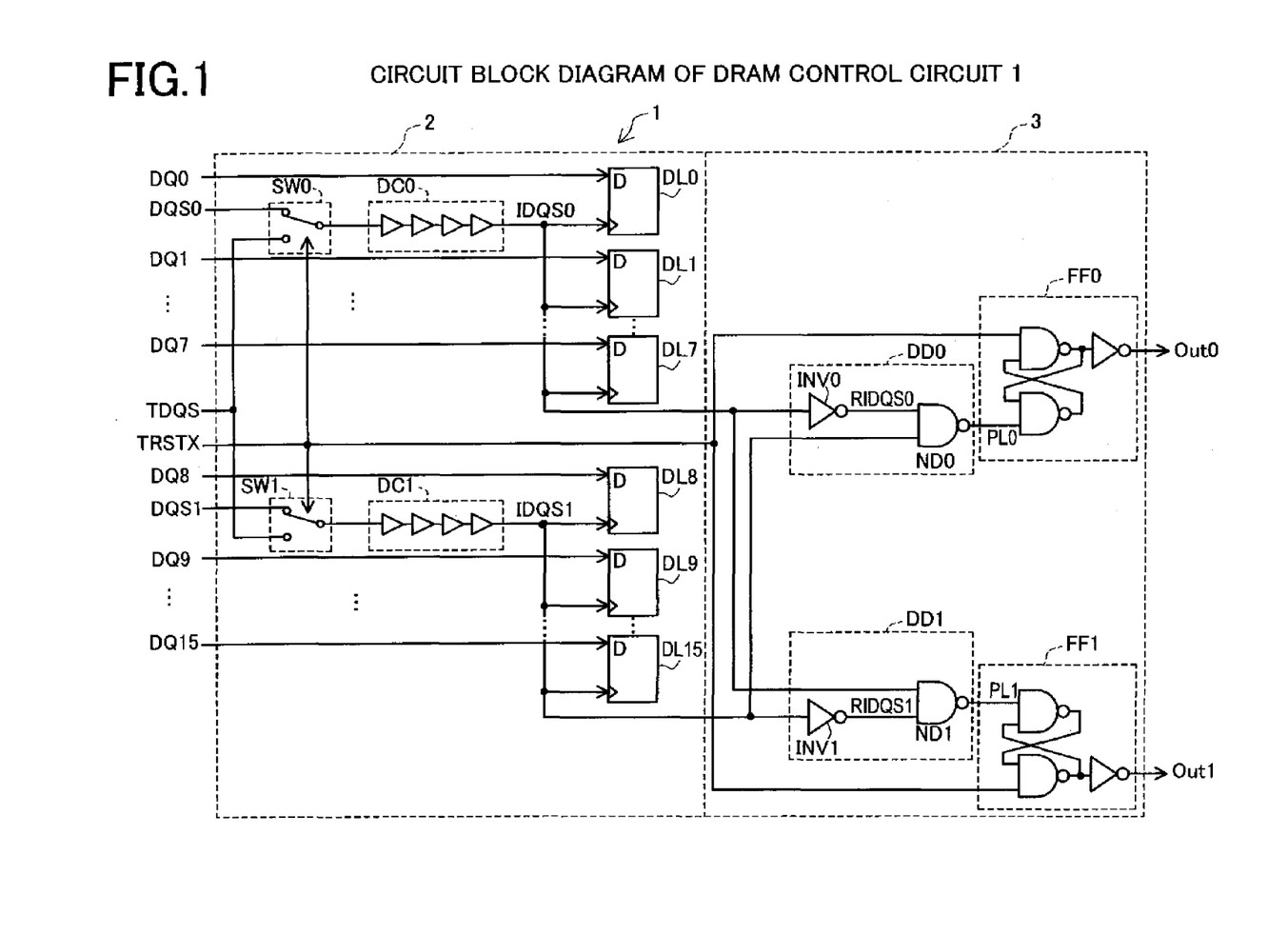
FIG. 1 is a circuit block diagram of a DRAM control circuit 1.

Hereinafter, as an embodied example of a semiconductor device in connection with the implementation of the present invention a first embodiment will be explained in detail with reference to FIGS. 1 through 4. FIG. 1 is a circuit block diagram of an embodiment of a DRAM control circuit 1. The DRAM control circuit 1 includes a data latch section 2 and a delay time determination section 3. The DRAM control circuit 1 is connected to a SDRAM, which is not shown. From the SDRAM, data DQ0 through DQ15 are inputted at a data transfer rate of 800 megabits per second (Mbps).

The data latch section 2 includes delay circuits DC0 and DC1, switches SW0 and SW1, and data latch circuits DL0 through DL15. Inputted into the respective input terminals Ds of the data latch circuits DL0 through DL15 are data DQ0 through DQ15 inputted from the SDRAM, which is not shown. A data strobe signal DQS0 is provided corresponding to the data DQ0 though DQ7, and a data strobe signal DQS1 is also provided corresponding to the data DQ8 through DQ15. In other words, one data strobe signal for every eight portions of data is prepared. Data strobe signals DQS0 and DQS1 are respectively inputted into the switches SW0 and SW1. A data strobe signal TDQS for testing is also inputted into the switches SW0 and SW1. The output terminal of the switch SW0 is connected to the input terminal of the delay circuit DC0, and the output terminal of the delay circuit DC0 is connected to the clock terminals of the data latch circuits DL0 through DL7. In a similar manner, the output terminal of the switch SW1 is connected to the input terminal of the delay circuit DC1, and the output terminal of the delay circuit DC1 is connected to the clock terminals of the data latch circuits DL8 through DL15. From the delay circuits DC0 and DC1, delay data strobe signals IDGS0 and IDQS1 are respectively outputted.

The delay time determination section 3 includes delay determination circuits DD0 and DD1, and flip-flops FF0 and FF1. The delay determination circuit DD0 includes an inverter INV0 and a NAND gate ND0. The inverter INV0 outputs, as a reverse data strobe signal RIDQS0, the delay data strobe signal IDQS0 that has been inputted. Inputted into the NAND gate ND0 are the reverse data strobe signal RIDQS0 and a delay data strobe signal IDQS1, and the NAND gate ND0 outputs a pulse signal PL0. The flip-flop FF0 is an RS flip-flop. A test mode signal TRSTX is inputted into the set terminal of the flip-flop FF0, and the pulse signal PL0 is inputted into the reset terminal thereof. Then, an output signal OUT0 is outputted from the output terminal of the flip-flop FF0. Further, the configuration of the delay determination circuit DD1 is identical to that of the delay determination circuit DD0, and the configuration of the flip-flop FF1 is identical to that of the delay determination circuit DD0, and a detailed description thereof will accordingly be omitted.

Figure 2:
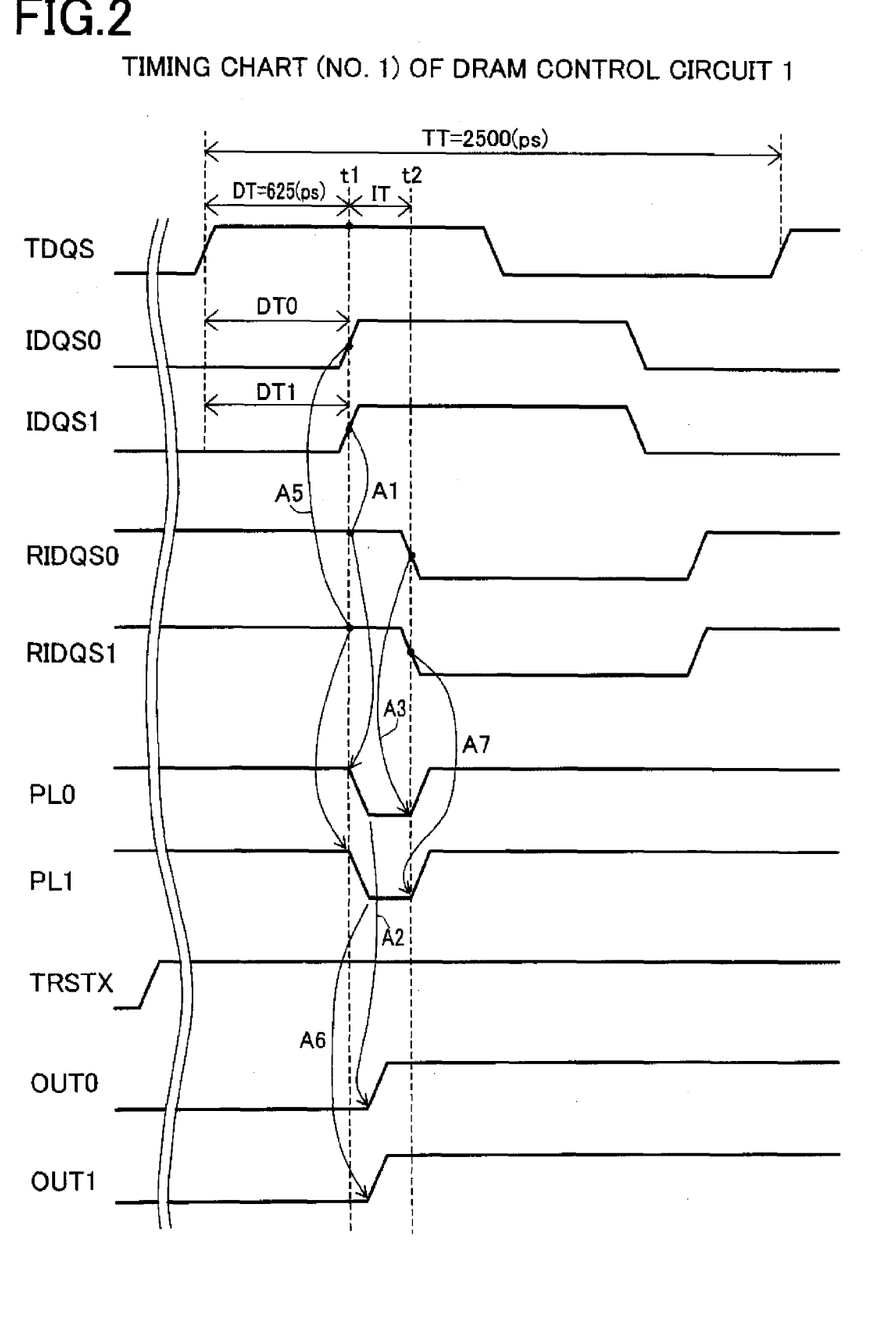
FIG. 2 is a timing chart (No. 1) of the DRAM control circuit 1.

The action of the DRAM control circuit 1 will be explained by reference to the timing chart in FIG. 2. FIG. 2 is a timing chart of occasions when delay times DT0 and DT1, produced in the delay circuits DC0 and DC1, are equal to each other. The DRAM control circuit 1 has a normal mode, in which a normal operation is performed, and a test mode, in which a functioning test is performed. In the normal mode, a test mode signal TRSTX outputted from a control circuit that is not shown is set at a low level. In response to the test mode signal TRSTX at a low level, the switches SW0 and SW1 select the data strobe signals DQS0 and DQS1, respectively, and input them respectively into the delay circuits DC0 and DC1. The delay circuits DC0 and DC1 are DLL circuits. In response to the data strobe signals DQS0 and DQS1 that has been inputted (whose cycle TT=2500 (ps)), the delay circuits DC0 and DC1 produce the delay data strobe signals IDQS0 and IDQS1 which have delayed by 90° in phase (¼ cycle). A delay setting time DT of the delay data strobe signals IDQS0 and IDQS1 is a set up hold time of the data latch circuits DL0 through DL15, and the value thereof is 625 (ps). The data latch circuits DL0 through DL15 latch the data DQ0 through DQ15 on the basis of the delay data strobe signals IDQS0 and IDQS1. As explained above, in the normal mode, the data DQ0 through DQ15 are read.

When the mode is changed to a testing mode, the testing mode signal TRSTX outputted from a control circuit, which is not shown, is elevated to a high level. In response to the elevation of the testing mode signal TRSTX to a high level, the switches SW0 and SW1 are switched, and the data strobe signal TDQS for testing is inputted into the delay circuits DC0 and DC1. Further, the cycle of the data strobe signal TDQS for testing is assumed to be equal to that of the data strobe signals DQS0 and DQS1. In response to the data strobe testing signal TDQS, the delay circuit DC0 produces the delay data strobe signals IDQS0 which have been delayed by 90° (delay time DT0). Further, in response to the data strobe testing signal TDQS, the delay circuit DC1 produces the delay data strobe signals IDQS1 which have been delayed by 90° (delay time DT1).

The delay data strobe signals IDQS0 and IDQS are respectively inputted into inverters INV0 and INV1. Then, from the inverters INV0 and INV1, reverse data strobe signals RIDQS0 and RIDQS1 are respectively outputted as reverse signals which have been delayed by only an allowable delay time IT. In this context, an allowable delay time IT means an allowable value of a deviation between the delay times DT0 and DT1, as will be described later. Further, the delay time IT is determined by the propagation delay time of the inverters INV0 and INV1. Hence, by means of adjusting the characteristics of transistors configuring the inverter elements, the delay time IT can be set as a minute period of time, for example, at several tens of picoseconds (ps).

Inputted into the NAND gate ND0 of the delay determination circuit DD0 are the delay data strobe signal IDQS1 and the reverse data strobe signal RIDQS0. At a time t1 (FIG. 2), when the delay data strobe signal IDQS1 is elevated to a high level, all the signals inputted into the NAND gate ND0 are made high level, and the pulse signal PL0 is accordingly relegated to a low level (shown by an arrow A1, in FIG. 2). When the pulse signal PL0 at a low level is inputted into the flip-flop FF0, the output signal OUT0 is elevated to a high level, whereby a high-level condition can be maintained (shown by an arrow A2). Then, at a time t2, which subsequent to time t1 has been delayed by an allowable delay time IT, when the reverse data strobe signal RIDQS0 is relegated to a low level, the pulse signal PL0 is elevated to a high level (shown by an arrow A3).

In a similar manner, inputted into the NAND gate ND1 of the delay determination circuit DD1 are the delay data strobe signal IDQS0 and the reverse data strobe signal RIDQS1. At a time t1 (FIG. 2), when the delay data strobe signal IDQS0 is elevated to a high level, all the signals inputted into the NAND gate ND1 are made high level, and the pulse signal PL1 is accordingly consigned to a low level (shown by an arrow A5, in FIG. 2). When the pulse signal PL1 at a low level is inputted into the flip-flop FF1, the output signal OUT1 is raised to a high level, whereby a high-level condition is maintained (shown by an arrow A6). Then, at a time t2, when the reverse data strobe signal RIDQS1 is relegated to a low level, the pulse signal PL1 is elevated to a high level (shown by an arrow A7).

Figure 3:
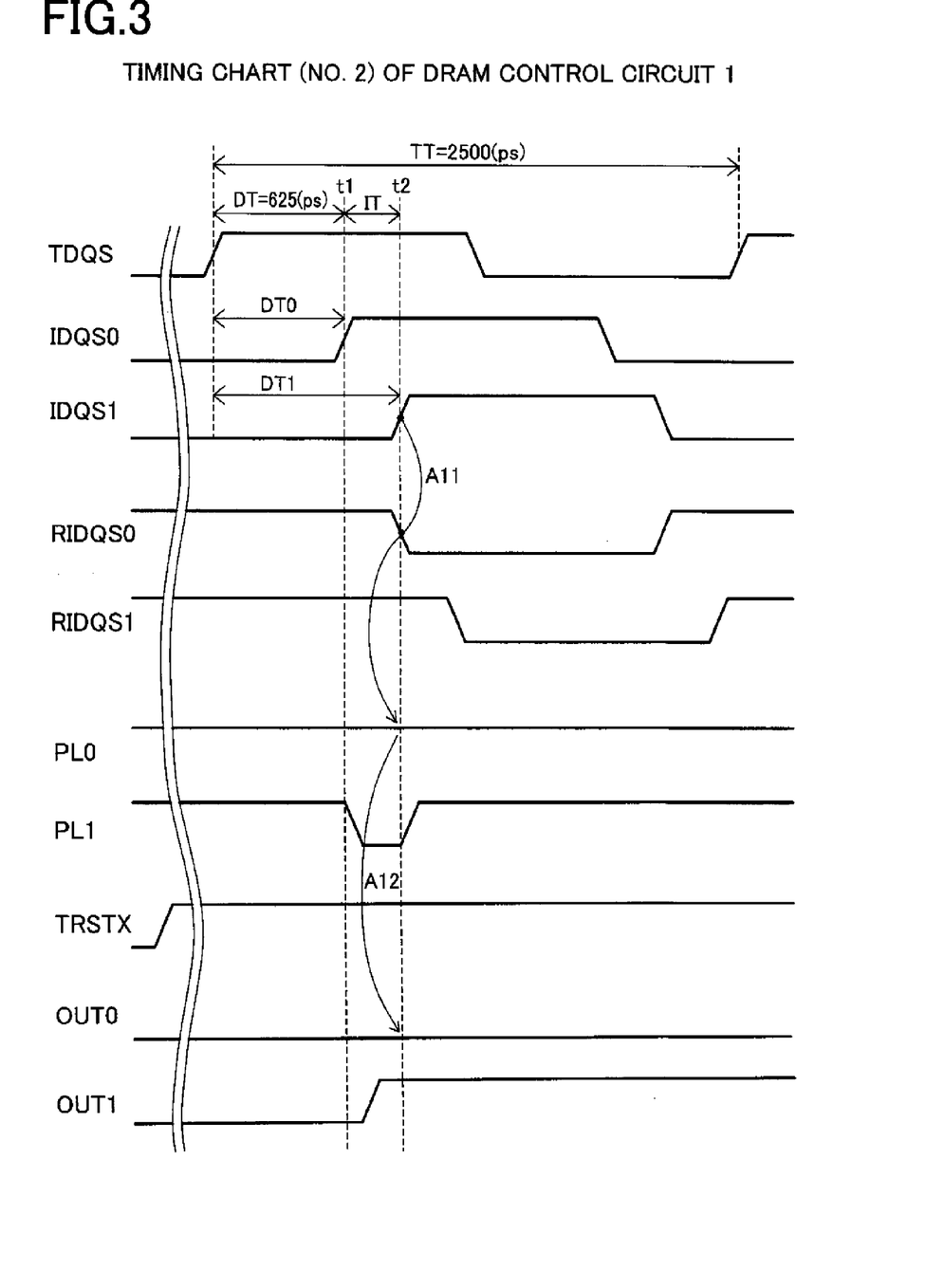
FIG. 3 is a timing chart (No. 2) of the DRAM control circuit 1.

Further, FIG. 3 is a timing chart illustrating a case where the delay time DT1 is made longer than the DT0 by the allowable delay time IT. At a time t2, when the delay data strobe signal IDQS1 is elevated to a high level, all the signals inputted into the NAND gate ND0 are not made a high level, and the pulse signal PL0 is accordingly maintained at a high level (shown by an arrow A11). Thus, the output signal OUT0 is maintained in a low level condition (shown by an arrow A12). Accordingly, it can be understood that when, compared with the phase of IDQS0, the phase of the delay data strobe signal IDQS1 is delayed by an allowable delay time IT or longer, the output signal OUT0 is not raised to a high level.

Figure 4:
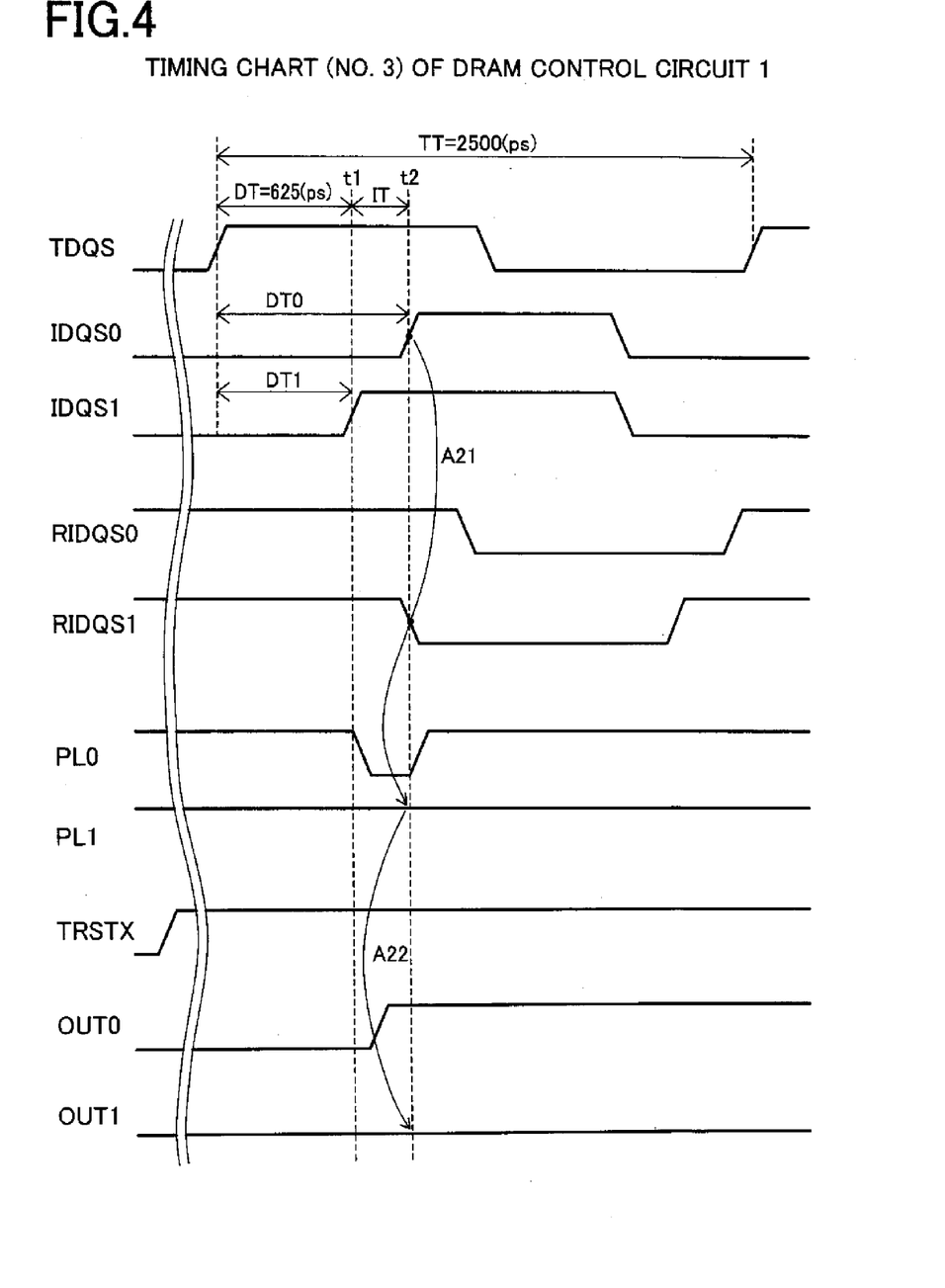
FIG. 4 is a timing chart (No. 3) of the DRAM control circuit 1.

Further, FIG. 4 is a timing chart illustrating a case where the delay time DT0 is made longer than the DT1 by the allowable delay time IT. At a time t2, when the delay data strobe signal IDQS0 is elevated to a high level, all the signals inputted into the NAND gate ND1 are not made a high level, and the pulse signal PL1 is accordingly maintained at a high level (shown by an arrow A21). Thus, the output signal OUT1 is maintained at a low level (shown by an arrow A22). Accordingly, it can be understood that when, compared with the phase of IDQS1, the phase of the delay data strobe signal IDQS0 is delayed by the allowable delay time IT or longer, the output signal OUT1 is not raised to a high level.

As will be apparent from the above description, it becomes possible to detect in the delay determination circuit DD0 whether or not, compared with the phase of IDQS0, the phase of the delay data strobe signal IDQS1 has been delayed by the allowable delay time IT or longer, and the results thus detected can be kept in the flip-flop FF0. Further, in a similar manner, it becomes possible to detect in the delay determination circuit DD1 whether or not, compared with the phase of IDQS1, the phase of the delay data strobe signal IDQS0 has been delayed by the allowable delay time IT or longer, and the results thus detected can be kept in the flip-flop FF1.

In this manner, monitoring takes place in the DRAM control circuit 1, as to whether or not the phases of the delay data strobe signals IDQS0 and IDQS1 have been separated from each other by the allowable delay time IT or longer, and it thus becomes possible to detect whether or not the deviation between the delay times DT0 and DT1 is within the allowable delay time IT. Then, the signal level of the output signals OUT0 and OUT1 can be read by using equipment such as a tester, and it can be understood that when both the output signals OUT0 and OUT1 are at a high level, the degree of deviation between the delay times DT0 and DT1 is within the allowable delay time IT.

As has been described above in detail, according to the DRAM control circuit 1 in connection with the first embodiment, by paying attention to the difference in phases between the delay data strobe signals IDQS0 and IDQS1 respectively outputted from the delay circuits DC0 and DC1, a calculation can be made in the delay determination circuits DD0 and DD1 as to whether or not a time difference caused by the phase difference is within the allowable delay time IT. Consequently, a determination can be made as to whether or not the degree of deviation between the delay time DT0 given by the delay circuit DC0 and the delay time DT1 given by the delay circuit DC1 is within the allowable delay time IT. Moreover, by means of detecting whether or not the degree of deviation is greater than the allowable delay time IT, it becomes possible to detect whether or not either of the delay times DT0 or DT1 has become an abnormal value. Thus, even with a semiconductor device having a circuit producing a minute delay time that is shorter than the time resolution of a tester, a semiconductor device without actually measuring the delay time, it becomes possible to determine whether is free of defects.

The results of determinations as to whether or not delay times DT0 or DT1 in the delay determination circuits DD0 and DD1 are abnormal values are held in the flip-flops FF0 and FF1. Thus, when the results thus have been determined are read from a semiconductor device, an expensive tester with a high time resolution can be dispensed with.

Further, a delay time IT can be set by means of the propagation delay time of the inverters INV0 and INV1. Thus, by adjusting the characteristics of transistors configuring the inverter elements, a delay time IT can be set at a minute time, for example, at several tens of (ps). Accordingly, without resorting to the use of an expensive tester with a high degree of time resolution, the occurrence or otherwise of a delay time deviation between delay circuits DC0 and DC1 can be detected with a very high degree of time accuracy. Further, it is possible to cope with abbreviations of the allowable delay time IT.

Delay circuits DC0 and DC1 produce the delay data strobe signals IDQS0 and IDQS1 on the basis of a data strobe signal TDQS used for testing as a common signal. Thus, it becomes possible to obtain more accurately, a deviation between delay times DT0 and DT1. Therefore, accuracy can be enhanced in the determination of a semiconductor device as a product without a defect.

Figure 5:
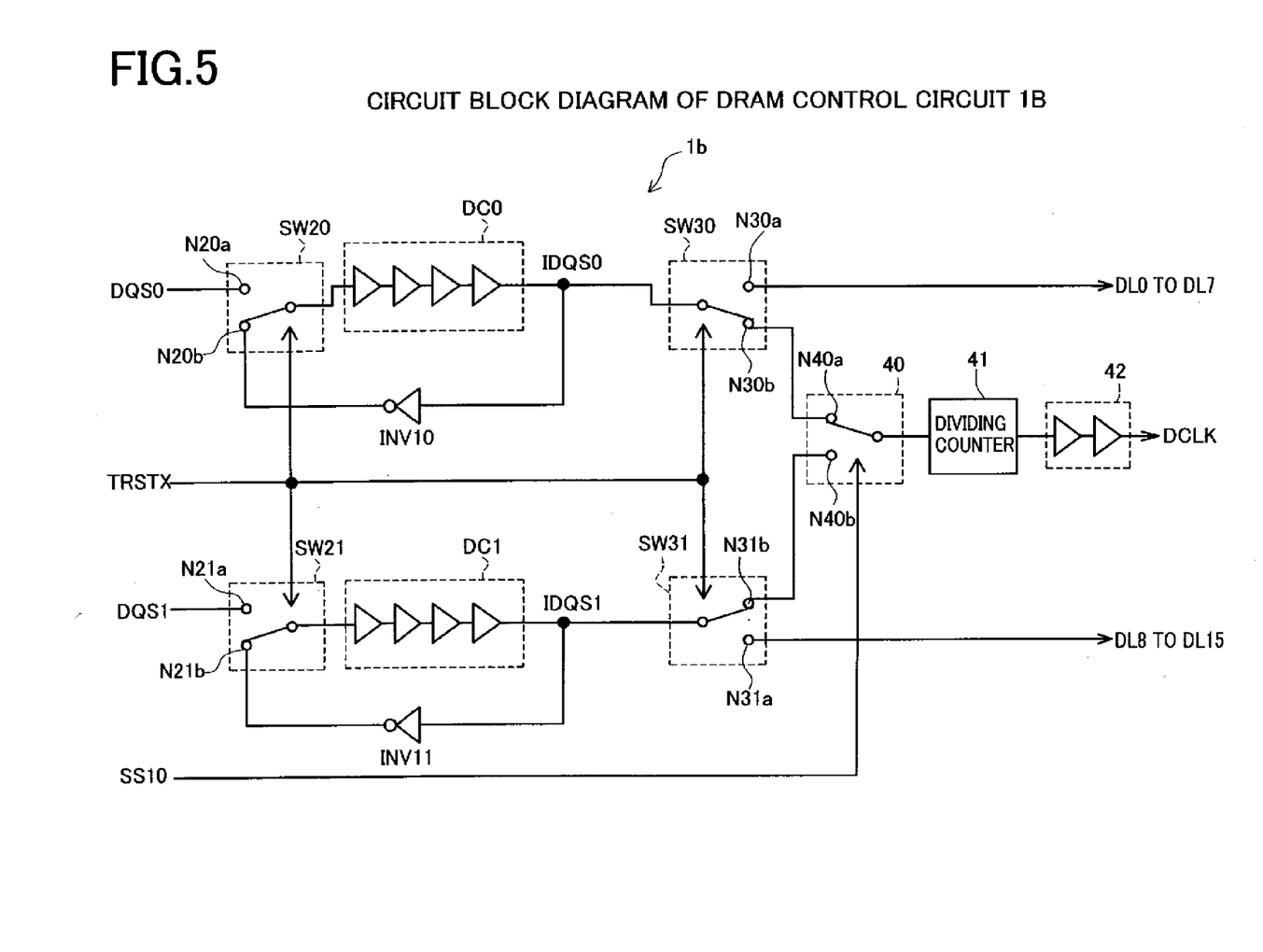
FIG. 5 is a circuit block diagram of a DRAM control circuit 1b.

A DRAM control circuit 1b in connection with a second embodiment of the present invention will now be explained with reference to FIG. 5. Inputted into nodes N20a and N21a of switches SW20 and SW21 are respectively the data strobe signals DQS0 and DQS1. Further, the delay data strobe signals IDQS0 and IQDS1 are inputted into nodes N20b and N21b of the switches SW20 and SW21 by way of inverters INV10 and INV11. A node N30a of a switch SW30 is connected to the data latch circuits DL0 through DL7, and a node N30b of switch SW30 is connected to a node N40a of a selector 40. Further, a node N31a of a switch SW31 is connected to the data latch circuits DL8 through DL15, and a node N31b of switch SW31 is connected to a node N40b of the selector 40. The output terminal of the selector 40 is connected to the input terminal of a dividing counter 41, and the output terminal of the dividing counter 41 is connected to the input terminal of a buffer 42. From the buffer 42, a dividing clock signal DCLK is outputted, and the dividing clock signal DCLK is inputted into a tester, which is not shown. Further, the test mode signal TRSTX is inputted into the switches SW20, SWS21, SW30 and SW31. The rest of the configuration is similar to that of the first embodiment, and a detailed explanation will accordingly be omitted.

The DRAM control circuit 1b includes a normal mode in which a normal operation is performed, and a test mode in which a functioning test is performed. In the normal mode, in response to the fact that the test mode signal TRSTX is made low level, the nodes N20a, N21a, N30a and N31a are selected in the switches SW20, SW21, SW30 and SW31. The delay data strobe signals IDQS0 and IQDS1 are accordingly inputted into the data latch circuits DL0 through DL15.

In the test mode, a case where the delay time of the delay circuit DC0 is measured will now be explained. First, by means of a control signal SS10, the node N40a is selected in the selector 40. In response to the move to the test mode, the test mode signal TRSTX is made high level. In response to the test mode signal TRSTX at a high level, the nodes N20b, N21b, N30b and N31b are respectively selected in the switches SW20, SW21, SW30 and SW31. Thus, by means of the delay circuit DC0 and the inverter INV10, a ring oscillator is configured.

In this context, the oscillation cycle of the ring oscillator is equivalent to a duration of time in which a logic value makes a round of a loop. Thus, the oscillation cycle of the ring oscillator that is configured by the delay circuit DC0 is made twice the total value of the delay time DT0 of the delay circuit DC0 and the delay time IT10 of the inverter INV10.

The oscillation signal outputted from the delay circuit DC0 is divided by the dividing counter 41. The dividing ratio of the dividing counter 41 is set at an appropriate level such that the cycle of the dividing clock signal DCLK becomes a value that does not exceed the time resolution of a tester. From the cycle of the dividing clock signal DCLK measured by the tester and the dividing ratio of the dividing counter 41, the delay time DT0 of the delay circuit DC0 can be calculated. Further, at a time when the delay time DT is calculated, when the delay time IT10 of the inverter INV10 is shorter than the delay time DT0 of the delay circuit DC0 to a satisfactory degree, the delay time IT10 may be ignored. Further, when the configuration of the elements of the inverter INV10 is the same as the configuration of the elements of the unit delay elements within the delay circuit DC0, the delay time DT0 may be calculated on the basis of an assumption that the delay time IT10 of the inverter INV10 is equal to the delay time of the unit delay elements.

Further, in the test mode, when the delay time of the delay circuit DC1 is measured, the node N40b is selected in the selector 40. Thus, the oscillation output signal of the ring oscillator configured by the delay circuit DC1 and the inverter INV11 is inputted into the dividing counter 41. Furthermore, the rest of the configuration is similar to a case where the delay time of the delay circuit DC0 is measured, and a detailed explanation will accordingly be omitted.

As described above in detail, according to the DRAM control circuit 1b in connection with the second embodiment, at a time of the functioning test, an oscillation signal is produced that has a cycle corresponding to the delay times DT0 and DT1 of the delay circuits DC0 and DC1, and the oscillation signal is divided. Thus, it becomes possible for the cycle to be measured by means of equipment such as a tester. Accordingly, from the value of the cycle of the oscillation signal that has been measured after being divided, and the dividing ratio of the dividing counter 41, delay times DT0 and DT1 can be obtained. In other words, not only is it possible to determine whether or not a delay time is within a specified value, but it also becomes possible to measure the value of the delay time itself.

In this way, abnormal delay times in the delay circuits DC0 and DC1 can be detected, and, a semiconductor device with a delay circuit whose delay time is abnormal can be singled out as a defective product.

Further, even when, because of a minute value of the time delay, the cycle of an oscillating signal becomes less shorter the time resolution of a tester, the oscillating signal is divided by the divider section, and then measured, and it thus becomes possible to measure the delay times DT0 and DT1.

Further, it goes without saying that the present invention is not limited to the above-mentioned embodiments, and that various improvements and modifications can be embodied within a scope that does not depart from the spirit of the invention. Although in the first embodiment, the delay determination circuits DD0 and DD1 have included the NAND gates ND0 and ND1, the present invention is not necessarily limited to this embodiment. It goes without saying that as long as a logic circuit can detect that an inputted signal is of an identical level, the circuit may be configured in combinations of a wide variety of logic gates. For example, in order to detect that inputted signals are all of a low level, a NOR gate may be provided instead of the NAND gates ND0 and ND1. In this context, it goes without saying that, the NOR gate can be configured of an AND gate, including an inverter at the input terminal thereof.

Further, in the first embodiment, a case has been explained where the delay circuits DC0 and DC1 have been provided so as to correspond to the data strobe signals DQS0 and DQS1. In other words, although when a plurality of signals to be delayed is present, a method has been explained of detecting whether or not the phase difference among these signals satisfies a specification, the present invention is not limited to such an embodiment. Even if the number of signals to be delayed is one when a plurality of delay circuits is present, the first embodiment can still be applied.

Figure 6:
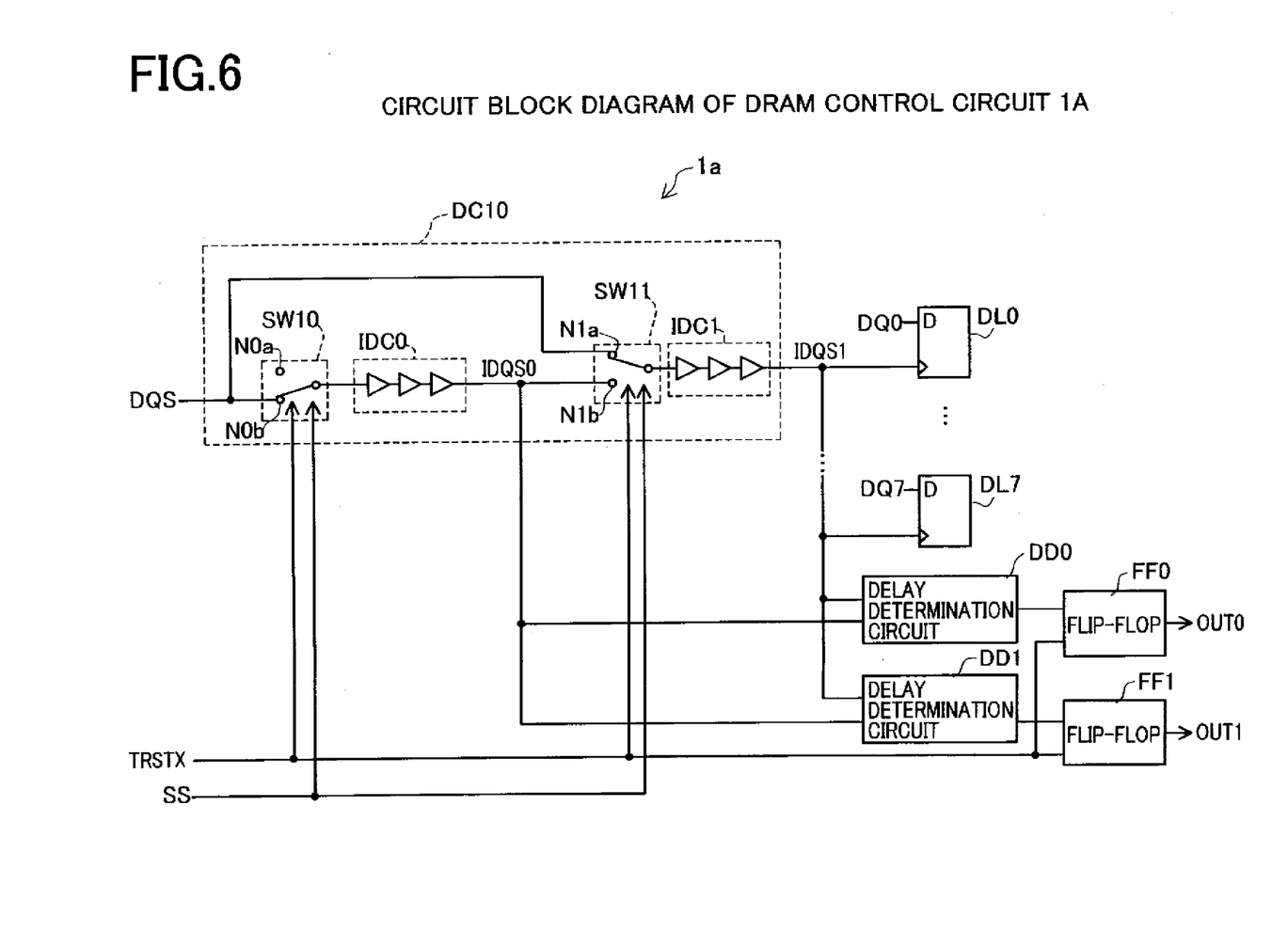

FIG. 6 illustrates a DRAM control circuit 1a in which the number of signals to be delayed is one (data strobe signal DQS). The DRAM control circuit 1a is a circuit which is capable of switching the degree of delay of the phase of a data strobe signal DQS to 90° (¼ cycle) or to 180° (½ cycle). Further, inputted into the DRAM control circuit 1a are the data strobe signal DQS and the data DQ0 through DQ7.

The DRAM control circuit 1a includes a delay circuit DC10. The delay circuit 10 includes a first delay circuit IDC0, a second delay circuit IDC1, and switches SW10 and SW11. The data strobe signal DQS is inputted into the switches SW10 and SW11. The output terminal of the switch 10 is connected to the input terminal of the first delay circuit IDC0. Further, the output terminal of the first delay circuit IDC0 is connected to the switch SW11, and to the delay determination circuits DD0 and DD1. The output terminal of the switch SW11 is connected to the input terminal of the second delay circuit IDC1. Further, the output terminal of the second delay circuit IDC1 is connected to the clock terminal of the data latch circuits DL0 through DL7, and the delay determination circuits DD0 and DD1. Inputted into the switches SW10 and SW11 are a test mode signal TRSTX outputted from a control circuit, which is not shown, and a phase control signal SS. By means of the switch SW10 and the first delay circuit IDC0, the phase of the data strobe signal DQS is delayed by 90°. Also, by means of the switch SW11 and the second delay circuit IDC1, the phase of the data strobe signal DQS is delayed by 90°. Further, the rest of the configuration is identical to that of the first embodiment, and a detailed explanation will accordingly be omitted.

The DRAM control circuit 1a includes a normal mode in which a normal operation is performed, and a test mode in which a function test is performed. In the normal mode, the test mode signal TRSTX is made low level. In order to obtain the delay data strobe signal IDQS1 obtained by delaying the phase of the data strobe signal DQS by 90°, in response to the phase control signal SS, a node N0a is selected in the switch SW10, and a node N1a is selected in the switch SW11. Hereby, by the switch SW11 and the second delay circuit IDC1, the phase of the data strobe signal DQS is delayed by 90°. On the other hand, in order to obtain the delay data strobe signal IDQS1 obtained by delaying the phase of the data strobe signal DQS by 180°, in response to the phase control signal SS, a node N0b is selected in the switch SW10, and a node N1b is selected in the switch SW11. Hereby, by the switch SW10, the first delay circuit IDC0, the switch SW11, and the second delay circuit IDC1, the phase of the data strobe signal DQS is delayed by 180°.

When the mode is moved to the test mode, the test mode signal TRSTX is made high level. In response to the test mode signal TRSTX at a high level, a node N0b is selected in the switch SW10, and a node N1a is selected in the switch SW11 (FIG. 6). Thus, with respect to the data strobe signal DQS, the first delay circuit IDC0 and the second delay circuit IDC1 are connected in parallel to each other. Accordingly, in response to the data strobe signal DQS both the phase of the delay data strobe signal IDQS0 outputted from the first delay circuit IDC0 and the phase of the delay data strobe signal IDQS1 outputted from the second delay circuit IDC1 become signals delayed by 90°.

As will be apparent from the above description, by switching the connection of the first delay circuit IDC0 and the second delay circuit IDC1 by use of the switches SW10 and SW11, in response to the data strobe signal DQS in the DRAM control circuit 1a, delay data strobe signals IDQS0 and IDQS1 can be obtained whose phases have been delayed by 90°. Moreover, it is possible to monitor whether or not the phase of the delay data strobe signals IDQS0 and IDQS1 have been separated from each other by the allowable delay time IT or more. Thus, it becomes possible to detect whether or not the degree of deviation between the delay time generated by the first delay circuit IDC0 and the delay time generated by the second delay circuit IDC1 is within the allowable delay time IT.

Further, although in the first embodiment, a case has been described where the number of delay circuits is two (the delay circuits DC0 and DC1), the present invention is not necessarily limited to such an embodiment. If the number of delay circuits is plural, any number thereof may be present. As an example, a DRAM control circuit 1c in a case where data of 32 bits (data DQ0 through DQ31) are inputted from an SDRAM, which is not shown, will be explained with reference to FIG. 7. At this time, the data strobe signals require four signals DQS0 through DQS3, and the delay circuits require four circuits DC0 through DC3, corresponding to the data strobe signals. Moreover, corresponding to the respective delay circuits DC0 through DC3, the delay determination circuits DD0 through DD3 are provided. Inputted into the NAND gate ND0 of the delay determination circuit DD0 are the reverse data strobe signal RIDQS0, and the delay data strobe signals IDQS1 through IDQS3 that are outputted from the delay circuits DC1 through DC3. Also, in a similar manner, inputted into the NAND gate ND1 of the delay determination circuit DD1 are the reverse data strobe signal RIDQS1 and the delay data strobe signals IDQS0, IDQS2 and IDQS3. Also, inputted into the NAND gate ND2 are the reverse data strobe signal RIDQS2 and the delay data strobe signals IDQS0, IDQS1 and IDQS3. Further, inputted into the NAND gate ND3 are the reverse data strobe signal RIDQS3 and the delay data strobe signals IDQS0 through IDQS2. The output signals OUT0 through OUT3 of the flip-flops FF0 through FF3 are inputted into an AND gate AD. From the AND gate AD, an output signal OUT20 is outputted. The rest of the configuration is identical to that of the first embodiment, and a detailed explanation will accordingly be omitted.

Figure 7:
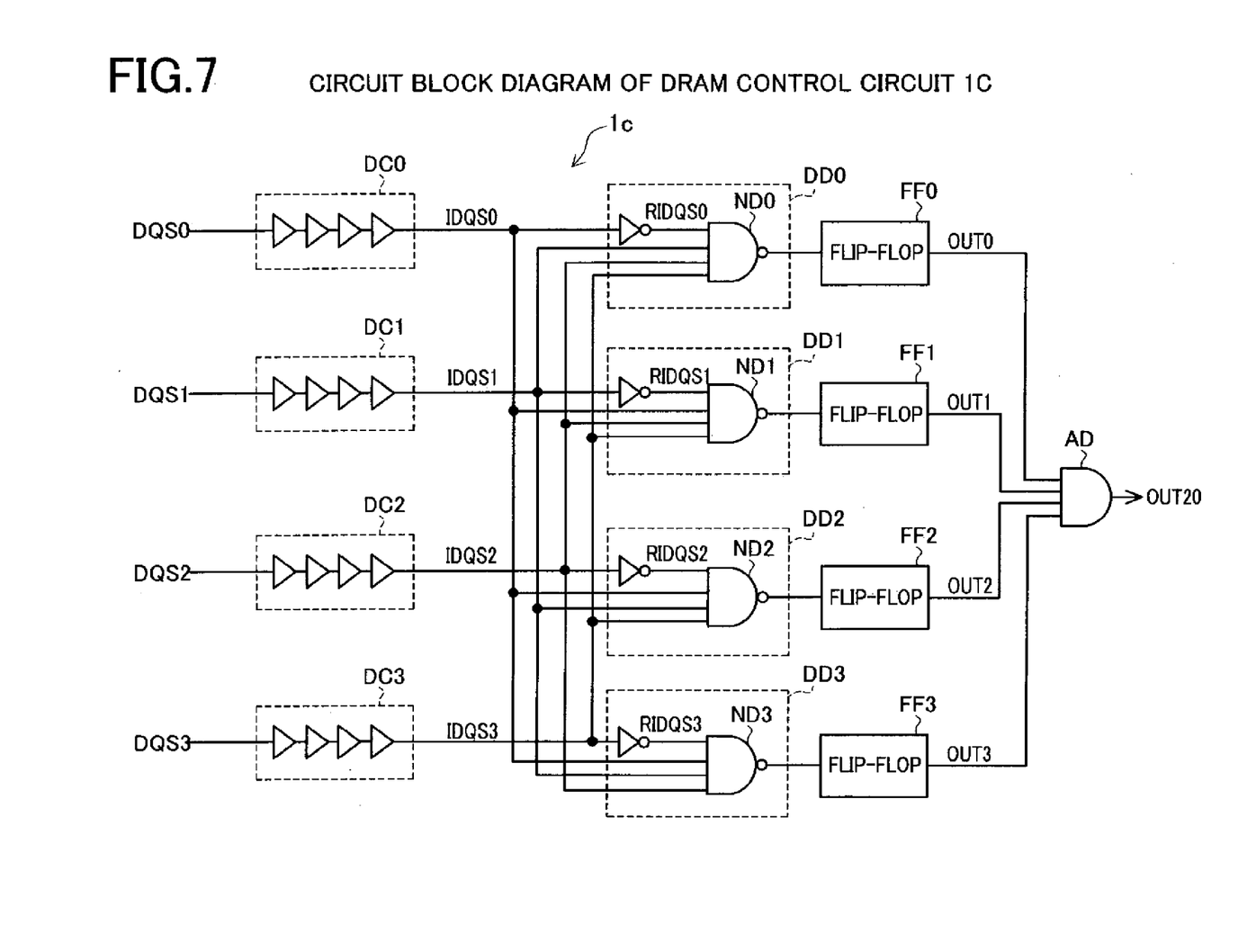
FIG. 7 is a circuit block diagram of a DRAM control circuit 1c.

In this manner, in the delay determination circuit DD0, and taking the phase of the delay data strobe signals IDQS0 as a standard, it is possible to detect whether or not the phase of at least one of the delay data strobe signals IDQS1 through IDQS3 has been delayed by the allowable delay time IT or more. Also, in a similar manner, in the delay determination circuit DD1, taking the phase of the delay data strobe signals IDQS1 as a standard; in the delay determination circuit DD2, taking the phase of the delay data strobe signals IDQS2 as a standard; and in the delay determination circuit DD3, taking the phase of the delay data strobe signals IDQS3 as a standard; in all three cases it is possible to detect whether or not the phase of the other respective delay data strobe signals has been delayed by the allowable delay time IT or more.

In this manner, it becomes possible to detect whether or not the phases of the delay data strobe signals IDQS0 through IDQS3 have been separated from each other by the allowable delay time IT or more. In other words, it becomes possible to detect whether or not the degree of deviation in delay time among delay circuits generated by the delay circuits DC0 through DC3 is within the allowable delay time IT. Moreover, by means of equipment such as a tester the signal level of the output signal OUT20 can be read, and a semiconductor device in which an output signal OUT20 is made at a high level can be selected as a product free from defects.

Further, the NAND gates ND0 through ND3 are an example of AND circuits; the switches SW0 and SW1 are an example of selector circuits; the test mode signal TRSTX is an example of a functioning test control signal; and the data strobe signal TDQS for testing is an example of a test signal.

By applying the present invention, even when the delay time given by a delay circuit is a minute value, it is still possible to determine whether or not the delay time is within a specified value; and further, a semiconductor device can be provided which dispenses with the requirement for a tester with a high time resolution for purposes of the determination, and a method of testing the semiconductor device.

What is claimed is:

1. A semiconductor device comprising:
a delay circuit configured to output an output signal to provide a delay time to an input signal,
a switch circuit configured to connect an output terminal and an input terminal of the delay circuit in response to a functioning test control signal to perform a functioning test, and
a dividing section configured to be connected to the output terminal of the delay circuit in response to the functioning test control signal, and to divide a cycle of the output signal of the delay circuit, wherein,
when the output terminal and the input terminal of the delay circuit are connected, the delay circuit operates as a ring oscillator.

2. The semiconductor device according to claim 1, wherein:
the delay circuit comprises an even number of delay elements, and
the switch circuit connects the output terminal and the input terminal of the delay circuit via an inverter.

3. A method of testing a semiconductor device which includes a delay circuit configured to output an output signal to provide a delay time to an input signal, and which is subject to a functioning test in response to a functioning test control signal, the method comprising:
connecting an output terminal and an input terminal of the delay circuit in response to the functioning test control signal, so as to make the delay circuit operate as a ring oscillator; and dividing a cycle of the output signal of the delay circuit which is operating as the ring oscillator.

4. A method of testing a semiconductor device which includes a delay circuit and a control circuit, the method comprising:
- outputting a functioning test control signal to perform a functioning test, by the control circuit;
- in response to the functioning test control signal, connecting an output terminal and an input terminal of the delay circuit to provide a delay time to an input signal, so as to make the delay circuit operate as a ring oscillator; and
- in response to the functioning test control signal, supplying, to a dividing section, an output signal of the delay circuit so as to output a dividing signal obtained by dividing a cycle of the output signal.

* * * * *